United States Patent [19]

Tomioka et al.

[11] Patent Number: 5,479,028
[45] Date of Patent: Dec. 26, 1995

[54] III-V SYSTEM COMPOUND SEMICONDUCTOR DEVICE AND METHOD FOR MANUFACTURING THE SEMICONDUCTOR DEVICE

[75] Inventors: Takeshi Tomioka; Hideyasu Ando; Naoya Okamoto; Shinji Yamaura, all of Kawasaki, Japan

[73] Assignee: Fujitsu Limited, Kanagawa, Japan

[21] Appl. No.: 310,761

[22] Filed: Sep. 27, 1994

[30] Foreign Application Priority Data

Sep. 28, 1993 [JP] Japan .................... 5-240862

[51] Int. Cl.$^6$ .................... H01L 33/00
[52] U.S. Cl. .................... 257/76; 257/200; 257/201
[58] Field of Search .................... 257/200, 201, 257/76

[56] References Cited

U.S. PATENT DOCUMENTS

| | | | |
|---|---|---|---|
| 4,833,193 | 5/1989 | Agostinelli et al. | 437/231 |
| 4,988,640 | 1/1991 | Bohling et al. | 437/81 |
| 5,036,022 | 7/1991 | Kuech et al. | 437/81 |
| 5,098,857 | 3/1992 | Kuech et al. | 437/107 |
| 5,244,829 | 9/1993 | Kim | 437/104 |

OTHER PUBLICATIONS

Kamp, "Carbon Incorporation in Mombe-Grown $Ga_{0.47}In_{0.53}As$"-Journal of Crystal Growth 95 (1989) pp. 154–157 North–Holland, Amsterdam.

Buchan "Carbon incorporation in metalorganic vapor phase epitaxy grown GaAs using $CH_yX_{4y}$, TMG and $AsH_3$"–Journal of Crystal Growth 110 (1991) pp. 405–414 North–Holland.

Chin "Highly carbon–doped p–type $Ga_{0.5}In_{0.5}As$ and $Ga_{0.5}In_{0.5}P$ by carbon tetrachloridein gas–source molecular beam epitaxy"–Appl. Phys. Lett., vol. 59, No. 22, 25 Nov. 1991 pp. 2865–2867.

Abernathy "Carbon Doping of III–V Compounds Grown by Mombe"–Journal of Crystal Growth 105 (1990) pp. 375–382.

Shirakashi, Jun–ichi et al, "P–Type Carbon–Doped InGaAs Grown by Metalorganic Molecular Beam Epitaxy", *Japanese Journal of Applied Physics*, vol. 30, No. 9B, (1991), pp. L1609–L1611.

*Primary Examiner*—Stephen D. Meier
*Attorney, Agent, or Firm*—Armstrong, Westerman, Hattori, McLeland, & Naughton

[57] ABSTRACT

The invention relates to a method for manufacturing a III-V system compound semiconductor device, provides such a new C dopant as alkyl halide ($CH_2I_2$ for example) containing carbon (C), iodine (I), and hydrogen (H) for giving a highly p-type conductivity to a GaAs crystal layer, an InGaAs crystal layer or the like as an object of it, and includes a process of forming a p-type III-V system compound semiconductor layer as using a compound containing carbon (C) as a dopant material for giving a p-type conductivity and further containing iodine (I) and hydrogen (H) as impurity.

4 Claims, 4 Drawing Sheets

III-V SYSTEM COMPOUND SEMICONDUCTOR DEVICE AND METHOD FOR MANUFACTURING THE SEMICONDUCTOR DEVICE

BACKGROUND OF THE INVENTION

1. Field of the Invention

The invention relates to a III-V system compound semiconductor device and a method for manufacturing the semiconductor device.

In recent years, it is required to realize a large-capacity and high-quality optical telecommunications system or a high-performance and high-speed computer, and in order to meet such requirements it is necessary to greatly improve semiconductor devices composing their respective electronic circuits in performance.

A heterojunction bipolar transistor (HBT) in particular attracts public attention as one of promising semiconductor devices and is expected to greatly improve semiconductor devices in speed.

In order to greatly improve such an HBT in speed, it is indispensable to reduce its base resistance by forming a high-density p-type base layer in a crystal growth process of the HBT.

2. Description of the Prior Art

Up to now, beryllium (Be) has been used as a p-type dopant for forming a p-type base layer of an HBT using a GaAs or InGaAs system compound.

Recently, however, carbon (C), which is smaller in diffusion coefficient than Be and therefore has less variation in distribution of impurities caused by a heat treatment after introduction into a semiconductor, has attracted attention.

And $CCl_4$ is reported as one of promising C dopant materials for GaAs or InGaAs crystals (reference literature: T. P. Chin et al. Appl. Phys. Lett. 59(22), November 1991).

However, since use of $CCl_4$ is scheduled to be completely prohibited by 1995 according to Montreal Protocol in relation to materials destroying ozone layers, it is an urgent necessity to develop a substitute material for $CCl_4$ as a C dopant material for giving a p-type conductivity to a GaAs crystal layer or particularly to an InGaAs crystal layer.

Up to now, an example in which C has been doped into a GaAs crystal by means of an MOCVD method as using $CH_2I_2$ instead of $CCl_4$ as a C dopant material has been reported (reference literature; T. F. Keuch et al. Mat. Res. Soc. Symp. proc. Vol. 204. p171, 1991).

According to these researches, however, density of positive holes in a GaAs crystal layer cannot be made higher than $7 \times 10^{17}/cm^3$ in case of growing the GaAs crystal layer by means of an ordinary MOCVD method as using $CH_2I_2$ as a C dopant material, and such density of positive holes as this degree fails in forming a high-density p-type base layer indispensable to a high-performance HBT.

Therefore, it is necessary to develop a crystal growing technology for growing such a binary system crystal layer as GaAs or such a ternary system crystal layer as InGaAs whose maximum density of positive holes is $10^{18}/cm^3$ or higher as using $CH_2I_2$ as a C dopant material and to determine its crystal growth condition.

There has not been an example of growing a ternary system p-type InGaAs crystal layer and the like as using $CH_2I_2$ as a C dopant material.

SUMMARY OF THE INVENTION

An object of the invention is to provide a new C dopant material such as alkyl halide ($CH_2I_2$ for example) containing carbon (C), iodine (I), and hydrogen (H) for giving a p-type conductivity to a GaAs crystal layer, an InGaAs crystal layer or the like.

The invention makes it possible to form a crystal layer containing positive holes of high density which is $10^{18}/cm^3$ or higher by forming a III-V system compound semiconductor layer of binary system (GaAs or the like) or ternary system(InGaAs or the like) by means of a gas source molecular beam epitaxy (hereinafter referred to as GSMBE) method, a chemical beam epitaxy (hereinafter referred to as CBE) method, a metal organic molecular beam epitaxy (hereinafter referred to as MOMBE) method, or a molecular beam epitaxy (hereinafter referred to as MBE) method as using a source material of compound semiconductor and alkyl halide ($CH_2I_2$ for example) containing C, I, and H as a dopant.

In this case, the invention can form a p-type crystal layer containing p-type impurities or more digits higher in density than a p-type crystal layer formed by an MOCVD method as using $CH_2I_2$.

The reason why a GSMBE method or the like can make a density of p-type impurities higher than an MOCVD method is thought to be as follows. Namely, it is thought that since the GSMBE method or the like operated in a depressurized environment (in lower pressure than $10^{-3}$ Torr) can do with a smaller quantity of $AsH_3$ to be used than the MOCVD method, in either case of a binary or ternary system, arsenic lattice sites in the epitaxial layer are easier to be occupied with C in the GSMBE method or the like than the MOCVD method. In case of a ternary system (an InGaAs crystal layer or the like), C usually becomes an n-type dopant, but by setting a proper condition, C becomes easier to be bonded with Ga than As and so it comes to show a property as a p-type dopant. Therefore, it is possible to increase the C content also by increasing Ga to In in content.

In this manner, by being used in a depressurized environment (particularly in lower pressure than $10^{-3}$ Torr) by means of a GSMBE method or the like, the alkyl halide containing C, I, and H acts as a very excellent C dopant for forming a p-type crystal layer of a III-V system compound semiconductor device, especially, a base layer containing p-type impurities of high density in an HBT or a positive hole feeding layer and a cap layer which contain p-type impurities of high density in an HEMT.

DESCRIPTION OF THE PREFERRED EMBODIMENTS OF THE INVENTION

Figure 1:
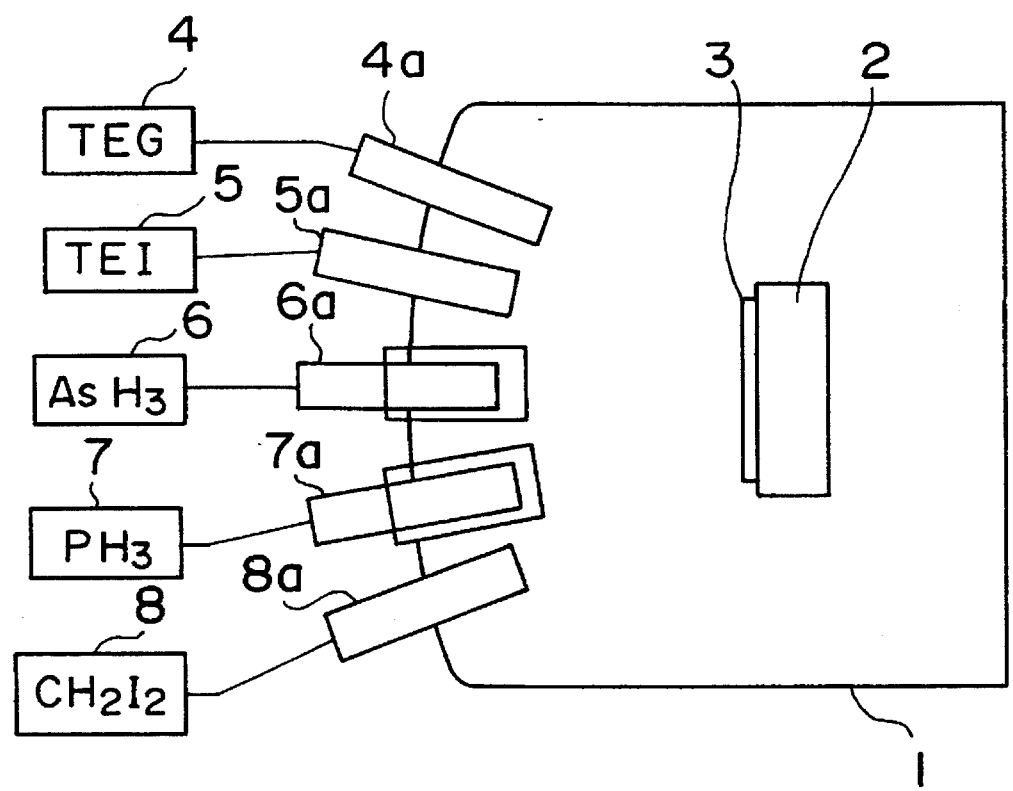
FIG. 1 is a side view showing a GSMBE apparatus for manufacturing a III-V system compound semiconductor device according to an embodiment of the invention.

As referring to the drawings, preferred embodiments of the invention are described in the following.

(Investigative experiment)

FIG. 1 is a compositional diagram of a GSMBE apparatus for growing a III-V system compound semiconductor layer related to embodiments of the invention.

In FIG. 1, reference number 1 is a growth chamber where a compound semiconductor layer is deposited, number 2 is a substrate holder for holding on it a substrate 3 on which a compound semiconductor layer is deposited, number 4 is a TEG bombe in which TEG is stored, number 4a is a TEG gas cell mounted in the growth chamber 1, number 5 is a TEI bombe in which TEI is stored, number 5a is a TEI gas cell mounted in the growth chamber 1, number 6 is an $AsH_3$ bombe in which $AsH_3$ is stored, number 6a is an $AsH_3$ cracking cell, number 7 is a $PH_3$ bombe in which $PH_3$ is stored, number 7a is a $PH_3$ cracking cell, number 8 is a $CH_2I_2$ bombe in which $CH_2I_2$ is stored, and number 8a is a $CH_2I_2$ gas cell.

The above-mentioned GSMBE apparatus uses triethyl gallium (TEG) and triethyl indium (TEI) for the group III source materials and arsine ($AsH_3$) and phosphine ($PH_3$) for the group V source materials, and uses diiodomethane ($CH_2I_2$) as a p-type carbon (C) dopant. Trimethyl gallium (TMG) and trimethyl indium (TMI) also can be used instead of the above-mentioned TEG and TEI for the group III source materials.

In this GSMBE apparatus, TEG is supplied onto the surface of the substrate 3 set on the substrate holder 2 inside the growth chamber 1 from the TEG bombe 4 through the TEG gas cell 4a. In the same manner as this, TEI is supplied onto the surface of the substrate 3 from the TEI bombe 5 through the TEI gas cell 5a. $AsH_3$ is supplied onto the surface of the substrate 3 from the $AsH_3$ bombe 6 through the $AsH_3$ cracking cell 6a. $PH_3$ is supplied onto the surface of the substrate 3 from the $PH_3$ bombe 7 through the $PH_3$ cracking cell 7a.

And $CH_2I_2$ which is a carbon (C) dopant material is supplied onto the surface of the substrate 3 from the $CH_2I_2$ bombe 8 through the $CH_2I_2$ gas cell 8a. In case of growing, for example, a GaAs crystal by means of this GSMBE apparatus, TEG containing Ga which is an element of the group III and $AsH_3$ containing As which is an element of the group V are supplied onto the surface of the substrate 3 at the same time.

And in case of growing, for example, an InGaAs crystal by means of this GSMBE apparatus, $AsH_3$ containing As which is an element of the group V and TEG containing Ga which is an element of the group III and TEI containing In which is an element of the group III are supplied onto the surface of the substrate 3 at the same time.

$CH_2I_2$ is supplied onto the surface of the substrate 3 on demand during growing a compound semiconductor layer. $CH_2I_2$ has a vapor pressure of about 12 mmHg at 70° C., and it is possible to obtain a vapor pressure sufficient for supplying $CH_2I_2$ to the growth chamber 1 by controlling a temperature of the $CH_2I_2$ material in a range from room temperature to 70° C. In case of supplying a $CH_2I_2$ gas to the growth chamber 1, therefore, it is possible to directly control a flow rate of the $CH_2I_2$ by means of an ordinary mass flow controller without using a carrier gas.

Figure 2:
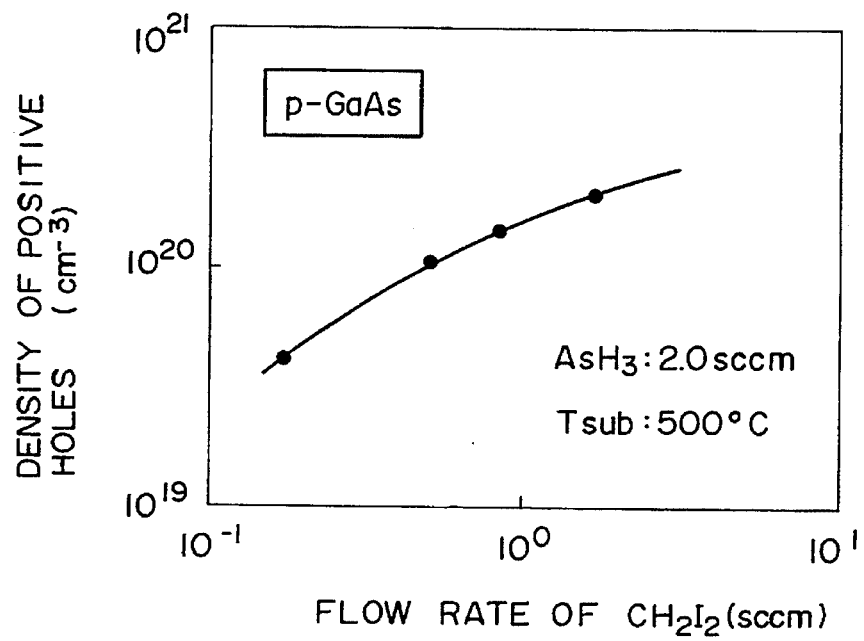
FIG. 2 is a characteristic diagram showing relation between density of positive holes in a p-GaAs crystal made by using $CH_2I_2$ as a C dopant and a flow rate of the $CH_2I_2$.

FIG. 2 is a characteristic diagram showing relation between density of positive holes in a p-GaAs layer formed by using $CH_2I_2$ as a C dopant and a flow rate of $CH_2I_2$. In FIG. 2, the axis of abscissas shows a flow rate (sccm) of $CH_2I_2$ introduced into the growth chamber during growth of a crystal layer, and the axis of ordinates shows density of positive holes inside the p-GaAs layer.

FIG. 2 shows a result of measurement in case of setting a growth temperature (Tsub) at 500° C. and a flow rate of $AsH_3$ at 2.0 sccm. According to FIG. 2, as increasing the flow rate of $CH_2I_2$ from 0.175 sccm to 1.72 sccm, a density of positive holes also increases and attains a maximum of $2.1 \times 10^{20}/cm^3$.

It is possible to increase the maximum density of positive holes in a crystal by lowering a growth temperature or a flow rate of $AsH_3$ without increasing a flow rate of $CH_2I_2$. This is clearly known from a reference literature C. R. Abernathy et al, Journal of Crystal Growth 105(1990) p375–382: Carbon doping of III-V compounds grown by MOMBE p.379 which shows an example of forming a p-type GaAs layer by means of an MOMBE method using TMG and $AsH_3$.

Figure 3:
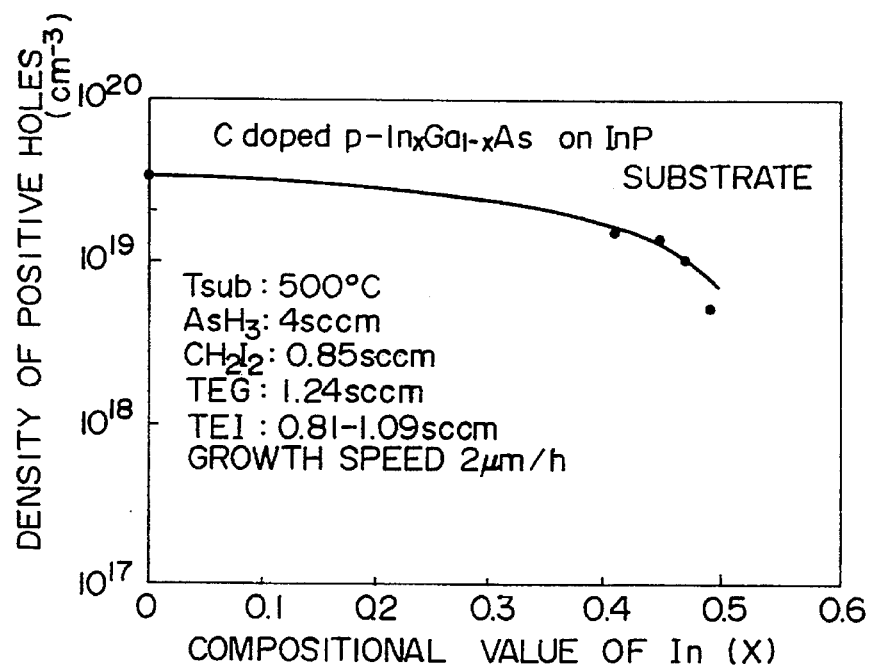
FIG. 3 is a characteristic diagram showing relation between density of positive holes and a compositional value of In (x) in a p-$In_xGa_{1-x}As$ crystal made by using $CH_2I_2$ as a C dopant.

FIG. 3 is a characteristic diagram showing correlation between a density of positive holes and a compositional value of In (x) in a p-type $In_xGa_{1-x}As$ layer formed by using $CH_2I_2$ as a C dopant. In FIG. 3, the axis of abscissas shows a compositional value of In (x) and the axis of ordinates shows a density of positive holes in the p-type $In_xGa_{1-x}As$ layer.

FIG. 3 shows a result of measurement in case of setting the substrate temperature (Tsub) at 500° C., a flow rate of $AsH_3$ at 4.0 sccm, a growth rate at 2 μm/h, and a flow rate of $CH_2I_2$ at 0.85 sccm.

According to FIG. 3, a trend is seen that a density of positive holes is reduced as a compositional value of In (x) is increased, and a density of positive holes (p) is equal to $5.1 \times 10^{18}/cm^3$ when a compositional value of In (x) is 0.49. It is thought that the reason why a density of positive holes increases when a compositional value of Ga to In is increased as described above is that Ga is easier to be bonded with C than In and a greater quantity of C is occupied with As lattice site in case of a greater quantity of Ga.

And in the same manner as a case of growing a p-GaAs crystal it is possible to greatly increase the maximum density of positive holes in a p-$In_xGa_{1-x}As$ layer by decreasing a growth rate, a flow rate of $ASH_3$, or a growth temperature.

According to an experimental result described above, $CH_2I_2$ is proved to be a promising p-type dopant material for a III-V system compound semiconductor of not only binary system (GaAs or the like) but also ternary system (InGaAs or the like).

(First embodiment)

Figure 4:
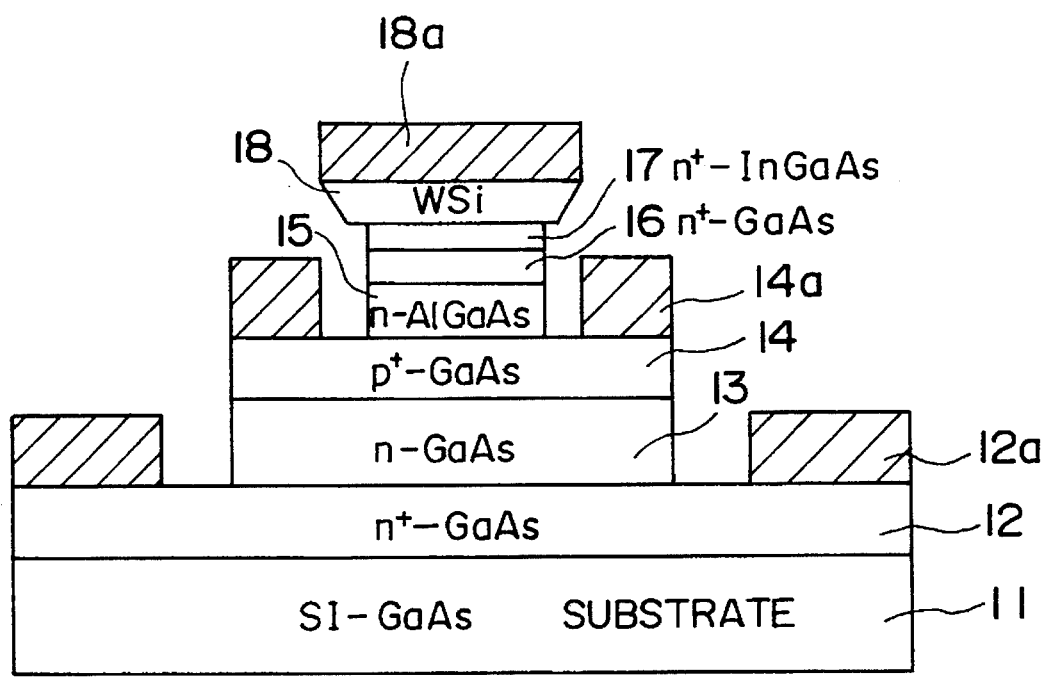
FIG. 4 is a cross-sectional view showing composition of an HBT of GaAs system according to a first embodiment of the invention.

FIG. 4 is a figure explaining composition of an HBT of GaAs system according to a first embodiment of the invention.

As shown in FIG. 4, an $n^+$-GaAs layer 12, an n-GaAs layer 13, a $p^+$-GaAs layer 14, an n-AlGaAs layer 15, an $n^+$-GaAs layer 16, an $n^+$-InGaAs layer 17, a collector electrode 12a, a base electrode 14a, a tungsten silicide layer 18, and an emitter electrode 18a are deposited one after another in layers on a semi-insulating GaAs substrate (SI-GaAs substrate) 11.

As referring to this, a method for manufacturing an HBT of GaAs system according to the first embodiment is described in the following.

First, by means of an MBE method known up to now, an $n^+$-GaAs layer 12 of $5\times10^{18}/cm^3$ in density of n-type impurity and of 5000Å in thickness to be a subcollector is formed on a semi-insulating GaAs substrate 11.

Next, an n-GaAs layer 13 of $3\times10^{16}/cm^3$ in density of n-type impurity and of 4000Å in thickness to be a collector layer is formed on the $n^+$-GaAs layer 12 by means of an MBE method.

Next, a $p^+$-GaAs layer 14 of $8\times10^{19}/cm^3$ in density of p-type impurity and of 1000Å in thickness to be a base layer is formed on the n-GaAs layer 13. At this time, the $p^+$-GaAs layer 14 is formed by means of an MBE method using $CH_2I_2$ as a p-type dopant. As shown in FIG. 2, it is possible to control an impurity density in the $p^+$-GaAs layer 14 to be a base layer in a range from $10^{19}/cm^3$ to $10^{20}/cm^3$ with changing a flow rate of $CH_2I_2$.

Next, by means of an MBE method, an n-AlGaAs layer 15 of $5\times10^{17}/cm^3$ in density of n-type impurity and of 1000Å in thickness to be a first emitter layer, an $n^+$-GaAs layer 16 of $5\times10^{18}/cm^3$ in density of n-type impurity and of 1000Å in thickness to be a second emitter layer, and an $n^+$-InGaAs layer 17 of $5\times10^{19}/cm^3$ in density of n-type impurity and of 1000Å in thickness to be an emitter cap layer are formed one after another on the $p^+$-GaAs layer 14.

Next, a collector electrode 12a of Cr/Au is formed on the $n^+$-GaAs layer 12 to be a subcollector, a base electrode 14a of Cr/Au is formed on the $n^+$-GaAs layer 14 to be a base layer, and an emitter electrode 18a is formed on the $n^+$-InGaAs layer 17 to be an emitter cap layer through a tungsten silicide (WSi) layer 18. In this manner, an HBT is fabricated.

A film forming method of the invention can be applied to not only a p-type base layer of an HBT of AlGaAs/GaAs system as described above but also a p-type base layer of an HBT of InGaP/GaAs system, InP/InGaAs system, InAlAs/InGaAs system or the like.

And it can be applied also to a p-type external base layer of an HBT in the same manner.

Furthermore, $CH_2I_2$ used in a film forming method of the invention is effective also as a p-type dopant introduced when regrowing a $p^{++}$-GaAs layer to be an external base layer.

Regrowing a $p^{++}$-GaAs layer to be an external base layer is performed in such a manner as the following. Namely, the $p^+$-GaAs layer 14 is selectively removed as remaining a part of the $p^+$-GaAs layer 14 of a base layer to expose the $n^+$-GaAs layer 13 at the both sides of the remaining $p^+$-GaAs layer 14, and a $p^{++}$-GaAs layer to be an external base layer is regrown on the exposing $n^+$-GaAs layer 13 to be a collector layer. As a result, the external base layer connects to the base layer at the side faces of it.

(Second embodiment)

The invention has an effect also on forming a p-type layer of an HEMT in addition to an HBT described in the first embodiment.

As referring to the drawings, composition of an HEMT of GaAs system related to a second embodiment of the invention and a method for manufacturing the HEMT are described in the following.

Figure 5:
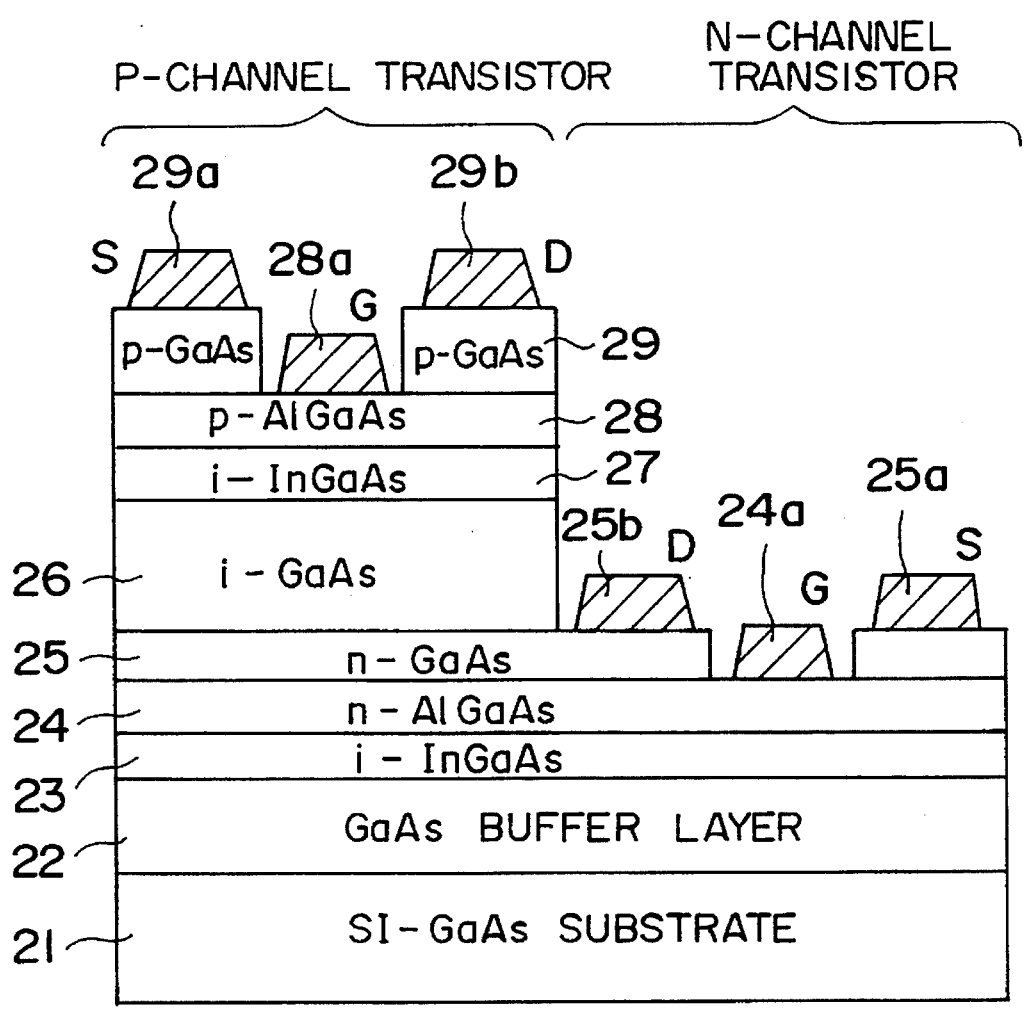
FIG. 5 is a cross-sectional view showing composition of a complementary HEMT of GaAs system according to a second embodiment of the invention.

FIG. 5 is a figure explaining the composition of a complementary HEMT of GaAs system according to the second embodiment of the invention. In FIG. 5, reference number 21 is a semi-insulating GaAs substrate (SI-GaAs substrate) common to an n-channel transistor and a p-channel transistor of a complementary HEMT, number 22 is a GaAs layer to be a common buffer layer formed on the semi-insulating GaAs substrate 21. Number 23 is an i-InGaAs layer, which becomes a channel layer of the n-channel transistor. Number 24 is an n-type AlGaAs layer formed on the i-InGaAs layer 23, and becomes an electron feeding layer of the n-channel transistor. Number 25 is an n-type GaAs layer formed on the fringe part except the middle part of the n-AlGaAs layer 24, and becomes a cap layer of a source and a drain of the n-channel transistor. And a gate electrode 24a is formed on the n-AlGaAs layer 24 and a source electrode 25a and a drain electrode 25a are formed on the n-GaAs layer 25 so that they may put the gate electrode 24a between them. And number 26 is an i-GaAs layer formed on a part of the n-GaAs layer 25 except the n-channel transistor area, and number 27 is an i-InGaAs layer formed on the i-GaAs layer 26 and becomes a channel layer of the p-channel transistor. Number 28 is a p-AlGaAs layer and becomes a positive hole feeding layer of the p-channel transistor.

Number 29 is a p-GaAs layer formed on the p-AlGaAs layer 28 and becomes a cap layer of the p-channel transistor. Number 28a is a gate electrode, which is formed on the p-AlGaAs layer 28, of the p-channel transistor. Number 29a is a source electrode, which is formed on the p-GaAs layer 29, of the p-channel transistor. And number 29b is a drain electrode, which is formed on the p-GaAs layer 29, of the p-channel transistor.

Next, a method for manufacturing an HEMT is described in the following.

First, by means of an MBE method known up to now, an i-GaAs layer 22 of 8000Å in thickness to be a buffer layer and an i-InGaAs layer 23 of 140Å in thickness to be a channel layer and an n-AlGaAs layer 24 of $1\times10^{18}/cm^3$ in density of n-type impurity and of 300Å in thickness to be an electron feeding layer and an n-GaAs layer 25 of $2\times10^{18}/cm^3$ in density of n-type impurity and of 500Å in thickness to be a cap layer and an i-GaAs layer 26 of 6000Å in thickness to be a buffer layer and an i-InGaAs layer 27 of 140Å in thickness to be a channel layer are formed one after another on a semi-insulating GaAs substrate 21.

Next, by means of a GSMBE method using TEI, TEG, and $AsH_3$ as source materials and $CH_2I_2$ as a p-type dopant, a p-AlGaAs layer 28 of $1\times10^{18}/cm^3$ in density of p-type impurity and of 300Å in thickness to be a positive hole feeding layer is formed on the i-InGaAs layer 27 in a depressurized atmosphere of a range from $10^{-3}$ to $10^{-4}$ Torr. After this, a p-GaAs layer 29 of $1\times10^{19}/cm^3$ in density of p-type impurity and of 500Å in thickness to be a cap layer is formed. In this embodiment, as shown in FIG. 2, it is possible to control the density of p-type impurity in the p-AlGaAs layer 28 to be a positive hole feeding layer and in the p-GaAs layer 29 to be a cap layer in a range from $10^{18}/cm^3$ to $10^{20}/cm^3$ by changing a flow rate of $CH_2I_2$.

Next, the p-GaAs layer 29, the p-AlGaAs layer 28, the i-InGaAs layer 27 and the i-GaAs layer 26 are selectively removed to expose the n-GaAs layer 25 in the n-channel transistor region.

In the n-channel transistor region, after removing the middle part of the n-GaAs layer 25, a gate electrode 24a of Cr/Au is formed on an exposed part of the n-AlGaAs layer 24, and a source electrode 25a and a drain electrode 25b of Cr/Au are formed on parts of the n-GaAs layer 25 at both sides of the gate electrode 24a.

On the other hand, in the p-channel transistor region, after removing the middle part of the p-GaAs layer 29, a gate electrode 28a of Cr/Au is formed on an exposed part of the p-AlGaAs layer 28, and a source electrode 29a and a drain electrode 29b of Cr/Au are formed on parts of the p-GaAs layer 29 at both sides of the gate electrode 28a.

Thus a complementary HEMT is fabricated.

The above-mentioned embodiments showed examples using $CH_2I_2$ as a p-type dopant when growing a III-V system compound semiconductor layer such as GaAs, InGaAs or the like, but it is possible to form a III-V system compound semiconductor layer containing p-type impurities of high density also by using alkyl halide containing C, I, and H, for example, $CHI_2$, $CH_3I$ or the like. And GaAs, AlGaAs, InGaP, InGaAs, InGaAsP or the like can be used as a III-V system compound semiconductor material to which the invention can be applied.

Furthermore, as a method for forming a III-V system compound semiconductor layer according to the invention, a GSMBE method, a CBE method, an MOMBE method, or an MBE method also can be used which grows a III-V system compound semiconductor layer in a depressurized atmosphere of lower pressure than $10^{-3}$ Torr.

As described above, according to the embodiments of the invention, a III-V system compound semiconductor layer of GaAs, InGaAs or the like containing a p-type impurity of so extremely high density as not to be obtained by means of an MOCVD method can be formed by means of a GSMBE method, a CBE method, an MOMBE method, or an MBE method which uses source materials of the compound semiconductor and alkyl halide ($CH_2I_2$ for example) containing C, I, and H as a dopant.

In this manner, the alkyl halide containing C, I, and H which can be used in a GSMBE method or the like acts as a very excellent C dopant for forming a p-type crystal layer of a III-V system compound semiconductor device, especially, a base layer containing p-type impurities of high density in an HBT or a positive hole layer and a cap layer containing p-type impurities of high density in a HEMT.

What is claimed is:

1. A III-V system compound semiconductor device comprising a III-V system compound semiconductor layer, which is at least $10^{18}/cm^3$ in density of positive holes, containing carbon as impurity for giving a p-type conductivity, and further containing iodine and hydrogen as impurity.

2. A III-V system compound semiconductor device according to claim 1, wherein the III-V system compound semiconductor layer is an external base layer of a heterojunction bipolar transistor.

3. A III-V system compound semiconductor device according to claim 1, wherein the III-V system compound semiconductor layer is a positive hole feeding layer and a cap layer of a p-type high electron mobility transistor.

4. A III-V system compound semiconductor device according to claim 1, wherein the III-V system compound semiconductor layer is one selected from a group of GaAs, AlGaAs, InGaP, InGaAs and InGaAsP.

* * * * *